(12) United States Patent
Liu

(10) Patent No.: US 12,556,146 B2
(45) Date of Patent: Feb. 17, 2026

(54) HIGH VOLTAGE DRIVER FOR DIGITAL POWER AMPLIFIER

(71) Applicant: QUALCOMM Incorporated, San Diego, CA (US)

(72) Inventor: Edward Wai Yeung Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 697 days.

(21) Appl. No.: 17/944,176

(22) Filed: Sep. 13, 2022

(65) Prior Publication Data

US 2024/0088845 A1   Mar. 14, 2024

(51) Int. Cl.
  *H03F 1/22*   (2006.01)
  *H03F 1/02*   (2006.01)
  *H03F 3/195*  (2006.01)
  *H03F 3/24*   (2006.01)

(52) U.S. Cl.
  CPC ........... *H03F 3/245* (2013.01); *H03F 1/0222* (2013.01); *H03F 3/195* (2013.01); *H03F 2200/451* (2013.01)

(58) Field of Classification Search
  CPC ........ H03F 3/245; H03F 1/0222; H03F 3/195; H03F 2200/451; H03F 3/005; H03F 3/217; H03F 3/72; H03F 2200/541; H03F 2200/61; H03F 1/523; H03F 3/213; H03F 3/3022; H03F 1/223; H03F 3/26; H03F 3/3088; H03F 1/22; H03F 3/3076; H03F 3/3066; H03F 3/3071; H03F 3/3001; H03F 3/345
  See application file for complete search history.

(56) References Cited

U.S. PATENT DOCUMENTS

| | | | |
|---|---|---|---|
| 9,214,933 B2 * | 12/2015 | Chern | H03K 19/018507 |
| 9,270,255 B2 * | 2/2016 | Kwon | H03K 3/012 |
| 9,979,387 B2 * | 5/2018 | Wu | H03K 19/01 |
| 11,183,976 B2 * | 11/2021 | Brantley | H03F 3/3022 |
| 2015/0244360 A1 | 8/2015 | Chern et al. | |
| 2020/0266768 A1 * | 8/2020 | Chen | H03F 3/193 |
| 2022/0109460 A1 | 4/2022 | Liu | |

FOREIGN PATENT DOCUMENTS

WO   2017130878 A1   8/2017

OTHER PUBLICATIONS

Hori S., et al., "A 1-Bit Digital Transmitter System using a 20-Gbps Quadruple-Cascode Class-D Digital Power Amplifier with 45nm SOI CMOS", 2019 IEEE MTT-S International Microwave Symposium, IEEE, Jun. 2, 2019, pp. 734-737, XP033579435, p. 734, paragraph II-p. 735, figure 2 p. 735, paragraph III-p. 736, figure 5.
International Search Report and Written Opinion—PCT/US2023/030641—ISA/EPO—Dec. 20, 2023.

(Continued)

*Primary Examiner* — Khanh V Nguyen
(74) *Attorney, Agent, or Firm* — Loza & Loza LLP

(57) ABSTRACT

A high voltage driver is provided that includes a PMOS stack of transistors arranged in series between a power supply node and an output node. The high voltage driver also includes an NMOS stack of transistors arranged between the output node and ground.

28 Claims, 8 Drawing Sheets

(56) References Cited

OTHER PUBLICATIONS

Kayyil A.V., et al., "Linearity Improvement Techniques for CMOS Switched-Capacitor Power Amplifiers", IEEE International Symposium on Circuits and Systems (ISCAS), Daegu, Korea, 2021, 5 pages.
Yoo S-M., et al., "A Class-G Dual-Supply Switched-Capacitor Power Amplifier in 65nm CMOS", 2012 IEEE Radio Frequency Integrated Circuits Symposium (RFIC), Montreal, QC, Canada, Jun. 17-19, 2012, IEEE, Piscataway, NJ, USA, Jun. 17, 2012, pp. 233-236, XP032203344, DOI: 10.1109/RFIC.2012.6242271, ISBN: 978-1-4673-0413-9.

* cited by examiner

HIGH VOLTAGE DRIVER FOR DIGITAL POWER AMPLIFIER

TECHNICAL FIELD

This application relates to amplifiers, and more particularly to a high voltage driver for a digital power amplifier.

BACKGROUND

Power amplifiers amplify radio frequency (RF) signals for transmission via an antenna. For example, mobile devices include a power amplifier to amplify an RF signal having a relatively low power. A power amplifier needs substantial gain to sufficiently amplify such a low-power RF signal. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

SUMMARY

A high voltage driver is disclosed that includes: a plurality of p-type metal-oxide semiconductor (PMOS) transistors arranged in series from a first PMOS transistor to (N−1)th PMOS transistor, wherein N is an integer of three or greater; an Nth PMOS transistor having a source coupled to a power supply voltage node and having a drain coupled to a source of the (N−1)th PMOS transistor; a first NMOS transistor having a source coupled to ground; a plurality of n-type metal-oxide semiconductor (NMOS) transistors arranged in series from a second NMOS transistor to an Nth NMOS transistor, the Nth NMOS transistor having a drain coupled to an output node of the voltage driver and the second NMOS transistor having a source coupled to a drain of the first NMOS transistor; a first clock source configured to drive a gate of the first NMOS transistor with a first clock signal that cycles between a power supply voltage (Vdd) during a first clock phase and ground during a second clock phase; and a second clock source configured to drive a gate of the Nth PMOS transistor with a second clock signal that cycles between N*Vdd during the first clock phase and (N−1)*Vdd during the second clock phase.

In addition, a power amplifier is provided that includes: a plurality of first voltage drivers, each first voltage driver including a plurality of N PMOS transistors coupled between a power supply node and an output node and including a plurality of N NMOS transistors coupled between the output node and ground, wherein N is a positive integer of 3 or greater; a decoder configured to decode a baseband signal to select whether each first voltage driver is inactive or active based upon a magnitude of the baseband signal and to phase a first clock signal and a second clock signal based upon a phase of the baseband signal, wherein the first clock signal is configured to cycle between ground and a power supply voltage (Vdd) to drive a gate of a first NMOS transistor in each plurality of N NMOS transistors in each active one of the first voltage drivers and the second clock signal is configured to cycle between (N−1)*Vdd and N*Vdd to drive a gate of an Nth PMOS transistor in each plurality of N PMOS transistors in each active one of the first voltage drivers; and a voltage summation circuit coupled to each output node and configured to sum an output voltage at each output node.

Moreover, a method of operation of a high voltage driver is provided that includes: during a first clock phase of a clock signal, switching off a plurality of N PMOS transistors arranged serially in a first sequence from a first PMOS transistor coupled to the output node to an Nth PMOS transistor coupled to a power supply node by charging a gate of each PMOS transistor in the first sequence to a product of a power supply voltage (Vdd) and an order of the PMOS transistor in the first sequence, wherein N is an integer of three or greater and wherein the power supply node is charged to N*Vdd; and grounding the output node during the first clock phase by switching on a plurality of N NMOS transistors arranged serially in a second sequence from a first NMOS transistor coupled to ground to an Nth NMOS transistor coupled to the output node by charging a gate of each NMOS transistor in the second sequence to Vdd.

Finally, a voltage driver is provided that includes: a plurality of PMOS transistors arranged in series from a first PMOS transistor to an Nth PMOS transistor, wherein the first PMOS transistor has a drain coupled to an output node and the Nth PMOS transistor has a source coupled to a power supply node, wherein N is an integer of three or greater; a plurality of NMOS transistors arranged in series from a first NMOS transistor to an Nth NMOS transistor, wherein the first NMOS transistor has a source coupled to ground and the Nth NMOS transistor has a drain coupled to the output node; a first multiplexer configured to select between a first power supply voltage and a second power supply voltage to drive a gate of the first PMOS transistor; and a second multiplexer configured to select between the first power supply voltage and the second power supply voltage to drive a gate of the Nth NMOS transistor.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
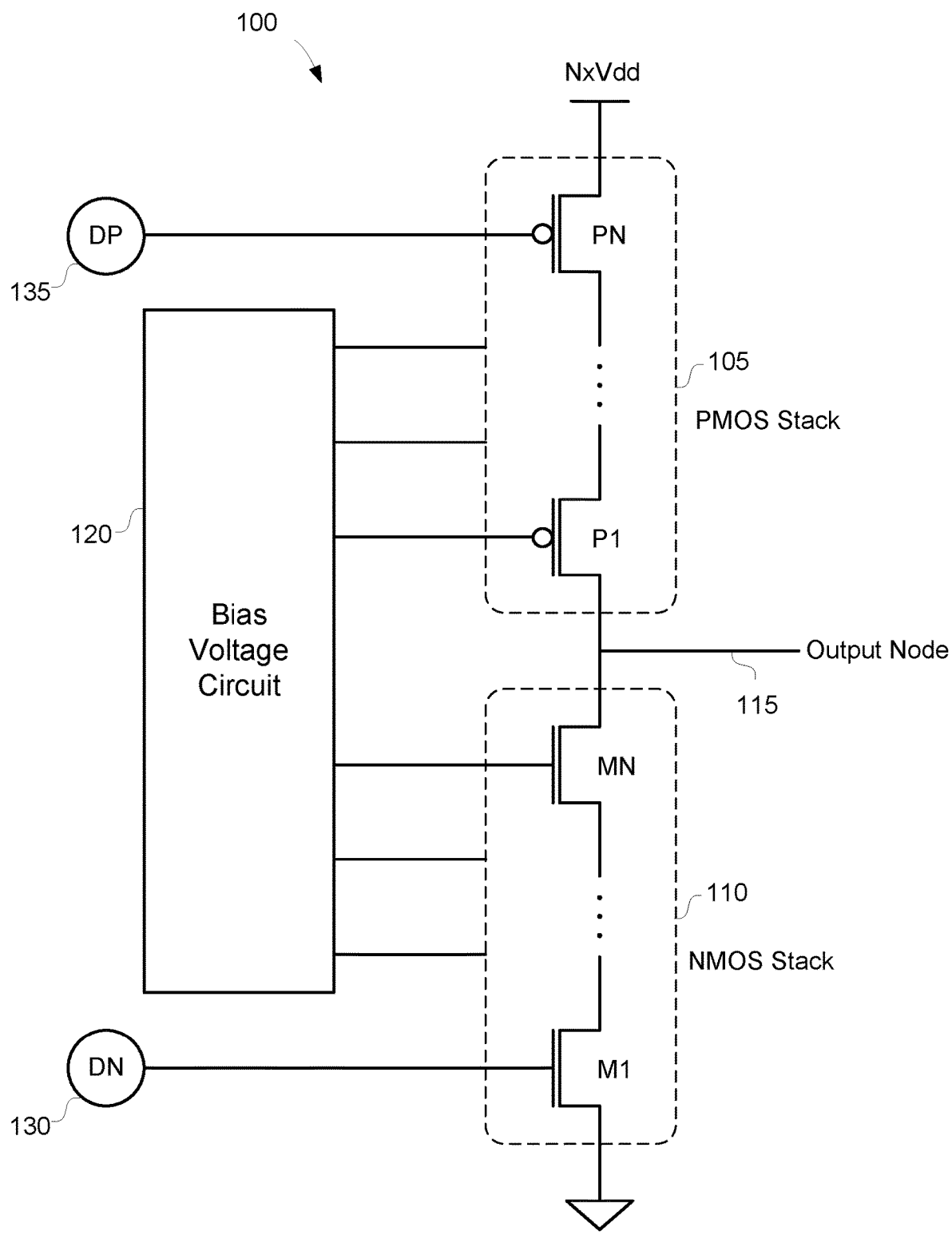
FIG. 1 is a circuit diagram of a high voltage driver in accordance with an aspect of the disclosure.

For improved efficiency, power amplifiers for high frequency applications are typically constructed using a III-V semiconductor such as gallium nitride (GaN). But the digital and baseband portion of a wireless device is generally constructed using a silicon-based technology such as complementary metal-oxide semiconductor (CMOS). A wireless device such as a cellular telephone or a WiFi station will thus require one or more integrated circuits for the CMOS portion and a separate GaN-based integrated circuit for the power amplifiers. This use of separate integrated circuits increases manufacturing costs and complexity. It would thus be advantageous if a transceiver could be implemented in a single CMOS-based integrated circuit. But such integration is problematic with respect to delivering a high output power. For example, an output power of 35 dBm requires a signal voltage of approximately 35.6 volts peak-to-peak at the transmitting antenna(s). But CMOS transistors at modern process nodes use a relatively low supply voltage such as 1 volt or less. To utilize a CMOS-based power amplifier thus typically requires the use of a step-up transformer. For example, a CMOS-based transistor that can accommodate a 1-volt power supply voltage may be able to output a 1-volt peak-to-peak sinusoidal output signal. A step-up transformer having a 1:35 turns ratio may then step up this relatively low output signal into the desired 35-volt peak-to-peak signal for driving the antenna. But integrating a transformer with so many turns into an integrated circuit is cumbersome, demands a lot of area, and causes significant power losses during operation.

With a power supply voltage limited to 1 V or less at some modern process nodes, the transistor can only produce a peak-to-peak output voltage (Vpp) that is also limited to be 1 volt or less. To provide a larger peak-to-peak output voltage, a power amplifier may thus stack transistors. For example, a common-gate transistor-stacked power amplifier uses a serial stack of transistors each having a common-gate configuration. Should the stack have four transistors in series, a peak-to-peak output voltage Vpp of approximately 4 times Vdd is possible. As the output voltage rises and falls, the gate voltages of the transistors in the stack must also rise and fall sufficiently to limit the gate-to-source/drain voltage for each transistor in the stack to not exceed the power supply voltage Vdd. The gate voltage for each transistor in the stack must thus track the drain/source voltage sufficiently (within a difference of Vdd) to prevent transistor damage or strain. In the common-gate configuration, this voltage tracking at the gate for each transistor in the stack may be implemented through a capacitor divider formed by a corresponding gate capacitor coupled to the gate of the transistor. This gate capacitor in combination with the parasitic gate-to-source/drain capacitance of the transistor forms the capacitor divider. As the stack height is increased to increase the peak-to-peak output voltage, the capacitance of each gate capacitor needs to be decreased to achieve the desired voltage tracking. It is difficult to implement such a relatively small gate capacitor, which limits the achievable stack height. In addition, capacitor dividers can distort the output signal. More generally, the common-gate configuration is an example of a transistor-stack-based amplifier architecture in which the voltage tracking is controlled in an analog fashion.

To provide high output power without the implementation issues and distortion of analog approaches, a high voltage driver for a digital power amplifier is disclosed. An example high voltage driver 100 is shown in FIG. 1. In the high voltage driver 100, a serial stack 105 of p-type metal-oxide semiconductor (PMOS) transistors couples between a power supply voltage node and an output node 115 for an output signal. A serial stack 110 of n-type metal-oxide semiconductor (NMOS) transistors couples between the output node 115 and ground. Each of the NMOS and PMOS stacks includes a plurality of N transistors, where N is a plural positive integer. The NMOS stack 110 ranges from a first NMOS transistor M1 having its source coupled to ground to an Nth NMOS transistor MN having its drain coupled to the output node 115. All the remaining transistors in the NMOS stack 110 couple in series between a drain of the first NMOS transistor M1 and a source of the Nth NMOS transistor MN. A first clock source 130 generates a first clock signal DN that drives the gate of the first NMOS transistor M1. In a first clock phase, the first clock signal DN is grounded whereas the first clock signal DN is charged to a power supply voltage Vdd whereas the clock signal DN is grounded in a second clock phase.

The PMOS stack 105 includes a Nth PMOS transistor PN having its source coupled to a power supply node 125 that is charged to N*Vdd. A first PMOS transistor P1 in the PMOS stack 105 has its drain coupled to the output node 115. All the remaining transistors in the PMOS stack 105 couple in series between a drain of the Nth PMOS transistor PN and a source of the first PMOS transistor P1. In the following discussion, it will be assumed that N is at least three. Should N equal three, the power supply node is thus charged to 3*Vdd. Similarly, if N equals four, the power supply node is charged to 4*Vdd, and so on. A second clock source 135 generates a clock signal DP that drives the gate of the Nth PMOS transistor PN. The second clock signal DP cycles at the same frequency as the first clock signal. In the first clock phase in which the first clock signal DN is charged to the power supply voltage Vdd, the second clock signal is charged to N*Vdd. As will be explained further herein, the output node 115 is discharged to ground during the first clock phase whereas it is charged to N*Vdd during the second clock phase. In the second clock phase while the first clock signal DN discharges to ground, the second clock signal DP lowers to a voltage of (N−1)*Vdd.

The NMOS stack 110 and the PMOS stack 105 have a complementary behavior with respect to the first and second clock phases. During the first clock phase, the NMOS stack 110 conducts whereas the PMOS stack 105 is switched off. Conversely, the NMOS stack 110 is switched off whereas the PMOS stack 105 conducts during the second clock phase. Since the PMOS stack 105 has N transistors arranged in series, its transistors may be deemed to be indexed or numbered in an order from the first PMOS transistor P1 having its drain coupled to the output node 115 to the Nth PMOS transistor PN having its source coupled to the power supply node. The Nth PMOS transistor PN has a drain coupled to a source of an (N−1)th PMOS transistor (not illustrated), and so on such that a second PMOS transistor (not illustrated) in the PMOS stack 105 has a drain coupled to a source of the first PMOS transistor P1. Similarly, the NMOS stack 110 has N transistors arranged in series such that its transistors may be deemed to be indexed or numbered beginning with the first NMOS transistor M1 and extending to an NMOS transistor MN having its drain coupled to the output node 115. The first NMOS transistor M1 has a drain coupled to a source of the second NMOS transistor (not illustrated), and so on such that an (N−1)th NMOS transistor (not illustrated) has a drain coupled to a source of the Nth NMOS transistor MN.

The conductive vs. non-conductive behavior of the NMOS and PMOS stacks will now be discussed in more detail. Note that the output voltage at the output node 115 has a known state for both the first clock phase and for the second clock phase. This is quite advantageous because a voltage bias circuit 120 may then control a gate voltage for the second through the Nth transistors in NMOS stack 110 and for the first through the (N−1)th transistor in the PMOS stack 105 accordingly to provide the appropriate amount of voltage tracking for their gate voltages so that the transistors in either stack are protected from excessive voltage or strain while the transistors are switched on or off. For example, the transistors in the PMOS stack 105 should be non-conductive during the first clock phase (all its transistors switched off) so that there is no conduction from the power supply node 125 through the PMOS stack 105 to the output node 115. Recall that the transistors in the PMOS stack 105 may all be deemed to be indexed or numbered successively starting from the first transistor P1. During the first clock phase, bias voltage circuit 120 may bias the first transistor P1 through the (N−1)th transistor in PMOS stack 105 according to its order in the stack. For example, during the first clock phase, the drain of transistor P1 is grounded. The bias voltage circuit 120 may thus charge the gate of transistor P1 to the power supply voltage Vdd during the first clock phase. A gate-to-drain voltage of transistor P1 is thus maintained at the safe level of Vdd during the first clock phase. To keep this same safe amount of a gate-to-drain voltage difference for the second through the (N−1)th transistor in the PMOS stack 105, the bias voltage circuit 120 applies a successively higher multiple of the power supply voltage to each successive transistor during the first clock phase. For example, the bias voltage circuit 120 may drive the second PMOS transistor (not illustrated) with a gate voltage of 2*Vdd during the first clock phase. Although the drain voltage of this second PMOS transistor is undefined due to the non-conductive state of the PMOS stack 105, the gate-to-drain voltage difference for the second PMOS transistor will not exceed the safe level of Vdd. Similarly, the bias voltage circuit 120 may drive a third PMOS transistor (not illustrated) with a gate voltage of 3*Vdd during the first clock phase and so on such that the gate voltage of the (N−1)th PMOS transistor (not illustrated) is charged to (N−1)*Vd. The Nth PMOS transistor PN is switched off during the first clock phase because the second clock signal DP charges the gate of transistor PN to N*Vdd at that time. It may thus be seen that the gate-to-drain and gate-to-source voltage difference across each transistor in the PMOS stack 105 does not exceed the power supply voltage Vdd during the first clock phase. Moreover, it may also be seen that the gate of each transistor in the PMOS stack 105 is charged to a product of Vdd and its order in the PMOS stack 105.

The NMOS stack 110 should be conductive during the first clock phase so that the output node 115 is discharged to ground. The first transistor M1 is switched on during the first clock phase because the first clock signal DN charges the gate of the first transistor M1 to the power supply voltage Vdd. Similarly, the bias voltage circuit 120 charges the gates of the remaining second NMOS transistor through the Nth NMOS transistor MN to the power supply voltage Vdd so that these transistors are also switched on during the first clock phase. The gate-to-source and gate-to-drain voltage difference for each transistor in NMOS stack 110 thus does not exceed the power supply voltage Vdd during the first clock phase.

In the second clock phase, the PMOS stack 105 conducts so that the output node 115 may be charged to N*Vdd. At the beginning of the second clock phase, the second clock signal DP falls to (N−1)*Vdd so that the Nth PMOS transistor PN is switched on. Similarly, the bias voltage circuit 120 charges the gates of the first PMOS transistor P1 through the (N−1)th transistor to (N−1)*Vdd so that these transistors are switched on as well. The gate-to-source and gate-to-drain voltage difference for each transistor in the PMOS stack 105 thus does not exceed the power supply voltage Vdd during the second clock phase.

The transistors in the NMOS stack 110 are switched off during the second clock phase so that the output node 115 may remain charged to N*Vdd. To provide a sufficient voltage tracking for the gates, each transistor in the NMOS stack 110 has its gate charged to a product of 1 less than its index or order within the NMOS stack with the power supply voltage Vdd. For example, the bias voltage circuit 120 charges the gate of the Nth transistor MN to (N−1)*Vdd. Similarly, the bias voltage circuit 120 charges the gate of the (N−1)th NMOS transistor (not illustrated) to (N−2)*Vdd and so on such that the gate of the second NMOS transistor (not illustrated) is charged to Vdd. The first clock signal DN grounds the gate of the first NMOS transistor M1 during the second clock phase so that this transistor is also off. The gate-to-source and gate-to-drain voltage difference for each of the transistors in the NMOS stack 110 thus does not exceed Vdd during the second clock phase.

Figure 2:
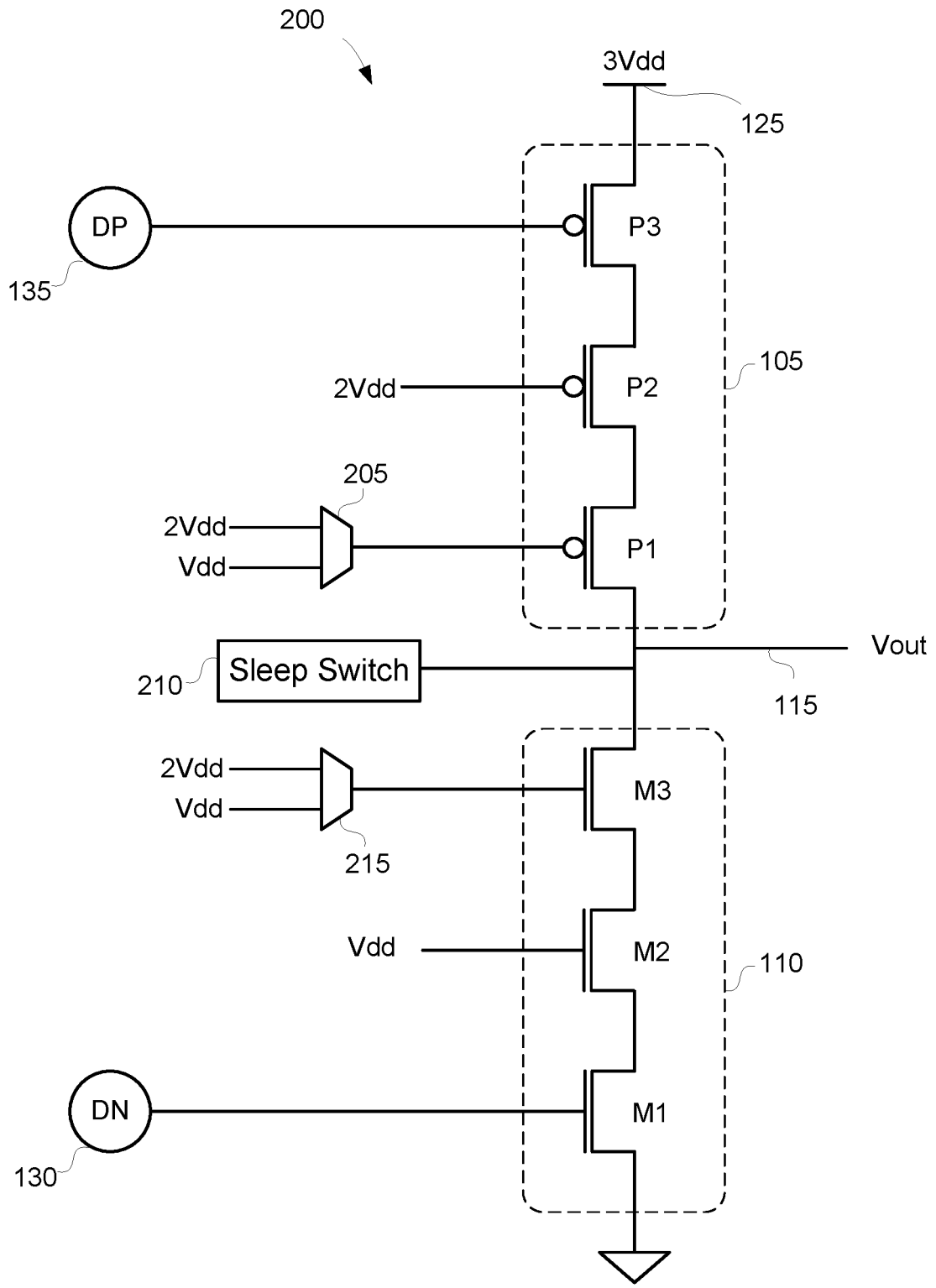
FIG. 2 is a circuit diagram of an implementation of the high voltage driver of FIG. 1 in which the NMOS and PMOS stacks each has three transistors in accordance with an aspect of the disclosure.

As compared to an analog approach such as the common-gate stack architecture discussed earlier, high voltage driver 100 can readily control the gate voltages of the NMOS and PMOS transistors so that the appropriate amount of voltage tracking at the transistor gates is achieved despite the relatively high (N*Vdd) Vpp of the output signal at the output node 115. Some example implementations of a high voltage driver will now be discussed. A high voltage driver 200 is shown in FIG. 2 in which the PMOS stack 105 and the NMOS stack 110 each has three transistors. The power supply node 125 thus supports a power supply voltage of 3*Vdd. When the PMOS stack 105 conducts and the NMOS stack 110 does not during the second clock phase, the output node 115 is thus driven to 3*Vdd. Similarly, the output node 115 is discharged during the first clock phase while the NMOS stack 110 conducts and the PMOS stack 105 does not. An output signal at the output node 115 will thus have a 3*Vdd peak-to-peak voltage. The PMOS stack 105 includes transistor P1, which has a source coupled to a drain of a PMOS transistor P2. The source of transistor P2 connects to a drain of a PMOS transistor P3. In turn the source of transistor P3 connects to the power supply node 125. Transistor P3 is thus the equivalent of transistor PN in high voltage driver 100.

The NMOS stack 110 includes transistor M1 having its source coupled to ground and a drain coupled to a source of an NMOS transistor M2. The drain of transistor M2 connects to a source of an NMOS transistor M3 that has a drain coupled to the output node 115. Transistor M3 is thus the equivalent of transistor MN in high voltage driver 100.

The clock signal DN drives the gate of transistor M1 and cycles between Vdd in the first clock phase and 0 V in the second clock phase. The clock signal DP drives the gate of transistor P3 and cycles between 3*Vdd in the first clock phase and 2*Vdd in the second clock phase. A voltage bias circuit for high voltage driver 200 includes a 2Vdd voltage source that drives the gate of transistor P2. This gate voltage is constant regardless of whether the clocks are in the first clock phase or the second clock phase. Similarly, a Vdd voltage source drives the gate of transistor M2 in both the first clock phase and the second clock phase. The voltage bias circuit for high voltage driver 200 also includes a first multiplexer 205 that selects between a 2*Vdd voltage source and a Vdd voltage source to drive the gate of transistor P1. First multiplexer 205 is configured to select for Vdd during the first clock phase and to select for 2*Vdd during the second clock phase. The voltage bias circuit for high voltage driver 200 further includes a second multiplexer 215 that selects between the 2*Vdd and the Vdd voltage sources to drive the gate of transistor M3. Multiplexer 215 is like multiplexer 205 in that multiplexer 215 is configured to select for Vdd during the first clock phase and to select for the 2*Vdd during the second clock phase.

As will be explained further herein, a power amplifier may include a plurality of drivers such as high voltage driver 200. Depending upon whether a given driver is active or inactive, it will contribute to a combined output signal that is a summation of the output signals from the active drivers. To provide a consistent output impedance while it is inactive (not contributing to the combined output signal), high voltage driver 200 includes a sleep circuit 210 that may also be denoted as a sleep switch. When high voltage driver 200 is active and thus contributing to the combined output signal, sleep circuit 210 is not conducting. But when high voltage driver is selected to be inactive and thus not contributing to the combined output signal, sleep circuit 210 conducts to charge the output node 115 with a constant voltage such as Vdd.

Figure 3A:
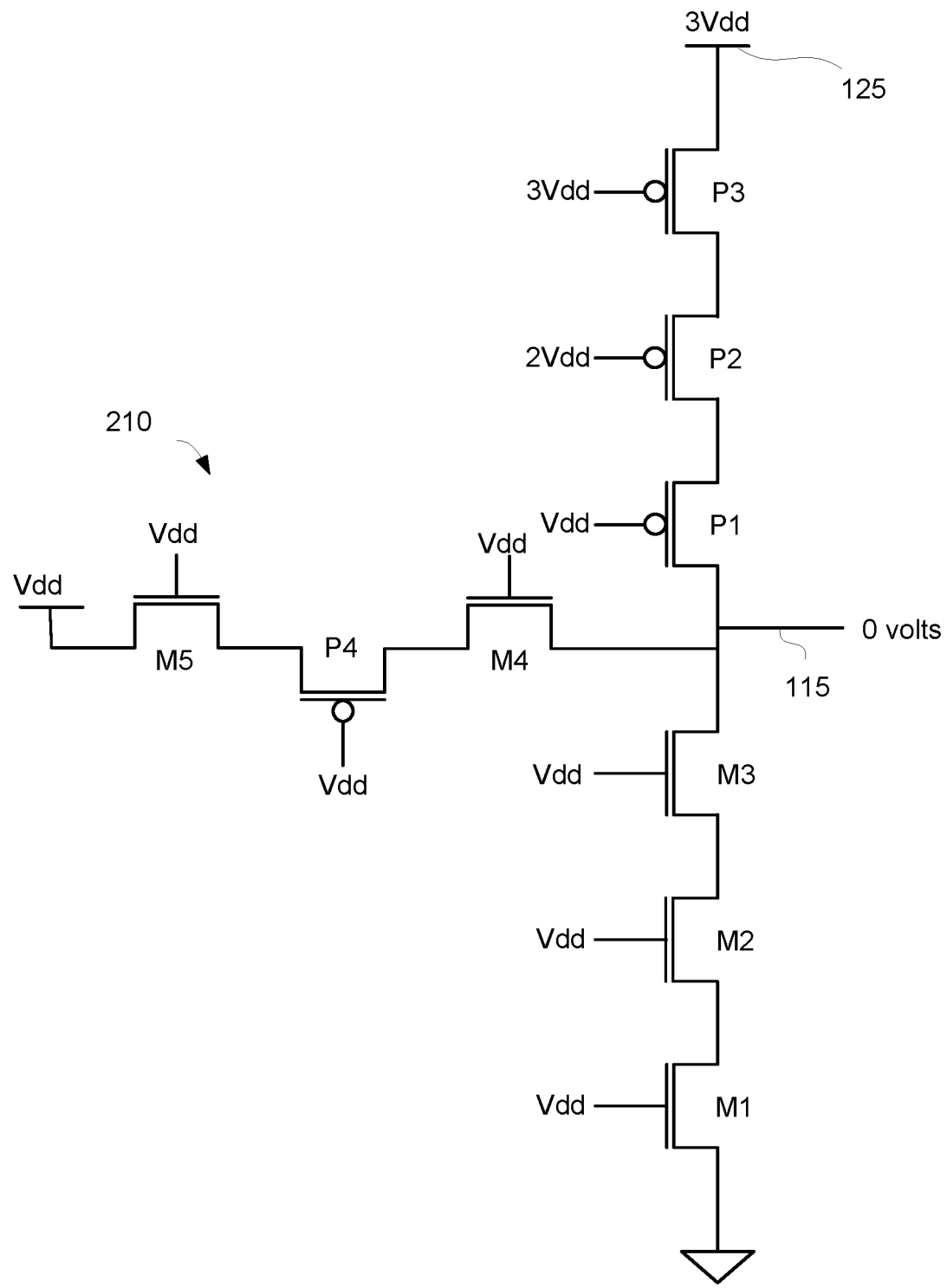
FIG. 3A is a circuit diagram of the high voltage driver of FIG. 2 showing the gate voltages of the NMOS and PMOS stacks and also of a sleep circuit during a first clock phase in accordance with an aspect of the disclosure.

The sleep circuit 210 is shown in more detail in FIG. 3A in which high voltage driver 200 is in the first clock phase. For illustration clarity, multiplexers 205 and 215 are not shown in FIG. 3A. As noted earlier, the transistors in the PMOS stack are biased according to a product of their order in the PMOS stack and Vdd during the first clock phase so that the PMOS stack is non-conductive. Since transistor P1 has an index or order of one, its gate voltage is Vdd. Similarly, transistor P2 is the is second transistor in the PMOS stack so its gate voltage is 2*Vdd. Finally, the clock signal DP is charged to 3*Vdd during the first clock phase so the gate voltage of transistor P3 is also a product of its order in the PMOS stack and Vdd. The gate-to-source voltage of transistor P3 is zero so it is switched off. The drain voltage of transistor P3 is then indeterminate but with the gate voltage of transistor P2 being 2*Vdd, the drain voltage of transistor P3 cannot drop below 2*Vdd. Similarly, the drain voltage of transistor P2 is indeterminate but with the gate voltage of transistor P1 being Vdd, the drain voltage of transistor P2 will not drop below Vdd. Transistors P1 through P3 will thus all be off during the first clock phase with a gate-to-source and gate-to-drain voltage difference of no more than Vdd. More generally, there are N transistors in the PMOS stack, ranging from a first PMOS transistor P1 having a drain coupled to the output node 115 to an Nth transistor having a source coupled to the power supply node 125. During the first clock phase, the bias voltage circuit charges the gate of transistor P1 to Vdd, the gate of transistor P2 to 2*Vdd, and so on such that the gate of the Nth PMOS transistor is charged to N*Vdd. In this fashion, each PMOS transistor is switched off during the first clock phase and has the appropriate amount of voltage tracking of its gate voltage to protect the PMOS transistor from being exposed to gate-to-source or gate-to-drain voltage difference of more than Vdd so as to ensure robustness against transistor strain or damage despite the elevated voltage of N*Vdd at the power supply node 125.

During the first clock phase, transistors M1 through M3 in the NMOS stack are all switched on so that the output node 115 is grounded. The clock signal DN is charged to Vdd during the first clock phase, which switches transistor M1 on. The gate voltage of transistors M2 and M3 is also Vdd so that these transistors are also switched on. The gate-to-source and gate-to-drain voltage difference for transistors M1 through M3 will thus not exceed Vdd during the first clock phase. More generally, there are N transistors in the NMOS stack, ranging from transistor M1 having its source coupled to ground to the Nth NMOS transistor having its drain coupled to the output node 115. The bias voltage circuit charges the gates of the second through the Nth NMOS transistor to Vdd while the DP clock signal DN charges the gate of the first NMOS transistor to Vdd during the first clock phase. The NMOS stack is thus conducting and discharging the output node 115 to ground during the first clock phase.

Sleep circuit 210 may be implemented through a serial coupling of an NMOS transistor M5, a PMOS transistor P4, and an NMOS transistor M4. Transistor M5 has a drain coupled to a power source for Vdd. A source of transistor M5 connects to a source of transistor P4. A drain of transistor P4 connects to a drain of transistor M4, which in turn has a source coupled to the output node 115. A suitable controller such as the voltage bias circuit (not shown in FIG. 3A) charges the gate of transistor M5 to Vdd so that transistor M5. With its gate and source both being charged to Vdd, the gate-to-source voltage for transistor M5 is thus 0 V such that transistor M5 is off. Similarly, the voltage bias circuit charges the gate of transistor P4 to Vdd during the first clock phase so that transistor P4 is also off. Although transistor M4 is switched on due to the voltage bias circuit charging its gate to Vdd during the first clock phase, sleep circuit 210 does not affect the voltage of output node 115 because transistors P4 and M5 are off.

Figure 3B:
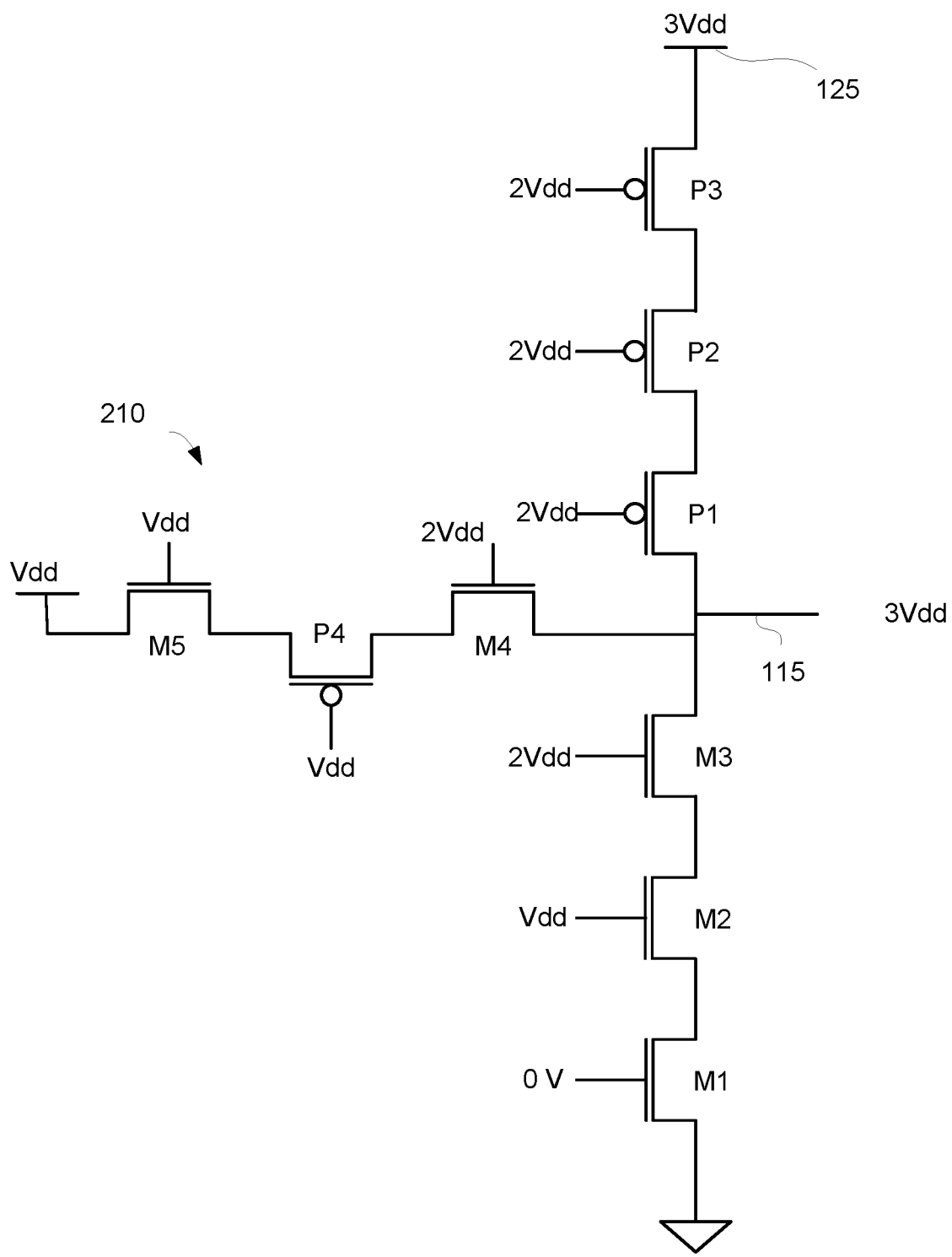
FIG. 3B is a circuit diagram of the high voltage driver of FIG. 2 showing the gate voltages of the NMOS and PMOS stacks and also of the sleep circuit during a second clock phase in accordance with an aspect of the disclosure.

The gate voltages of the transistors in high voltage driver 200 during the second clock phase are shown in FIG. 3B. As with FIG. 3A, multiplexers 205 and 215 are not shown for illustration clarity. The gate voltages for transistors M5 and P4 in the sleep circuit 210 are as discussed for FIG. 3A. Since the output voltage is now 3Vdd, the gate voltage for transistor M4 is increased to 2Vdd to protect transistor M4 from excessive voltage stress. Sleep circuit 210 is thus in a non-conductive state during both the first clock phase and the second clock phase. The gate of each transistor in the PMOS stack is biased to 2*Vdd. Each transistor in the PMOS stack is thus conducting such that the output node 115 is charged to 3*Vdd. Thus, the gate-to-source and gate-to-drain voltage differences for each PMOS transistor does not exceed Vdd during the second clock phase. To make the NMOS stack non-conductive during the second clock phase, each NMOS transistor has its gate biased to a product of one less than the NMOS transistor's order in the NMOS stack and Vdd. For example, the gate of transistor M3 is biased to 2*Vdd. Similarly, the gate of transistor M2 is biased to Vdd. Finally, the gate of transistor M1 is grounded. Thus, the gate-to-source and gate-to-drain voltage differences for each NMOS transistor does not exceed Vdd during the second clock phase.

Figure 3C:
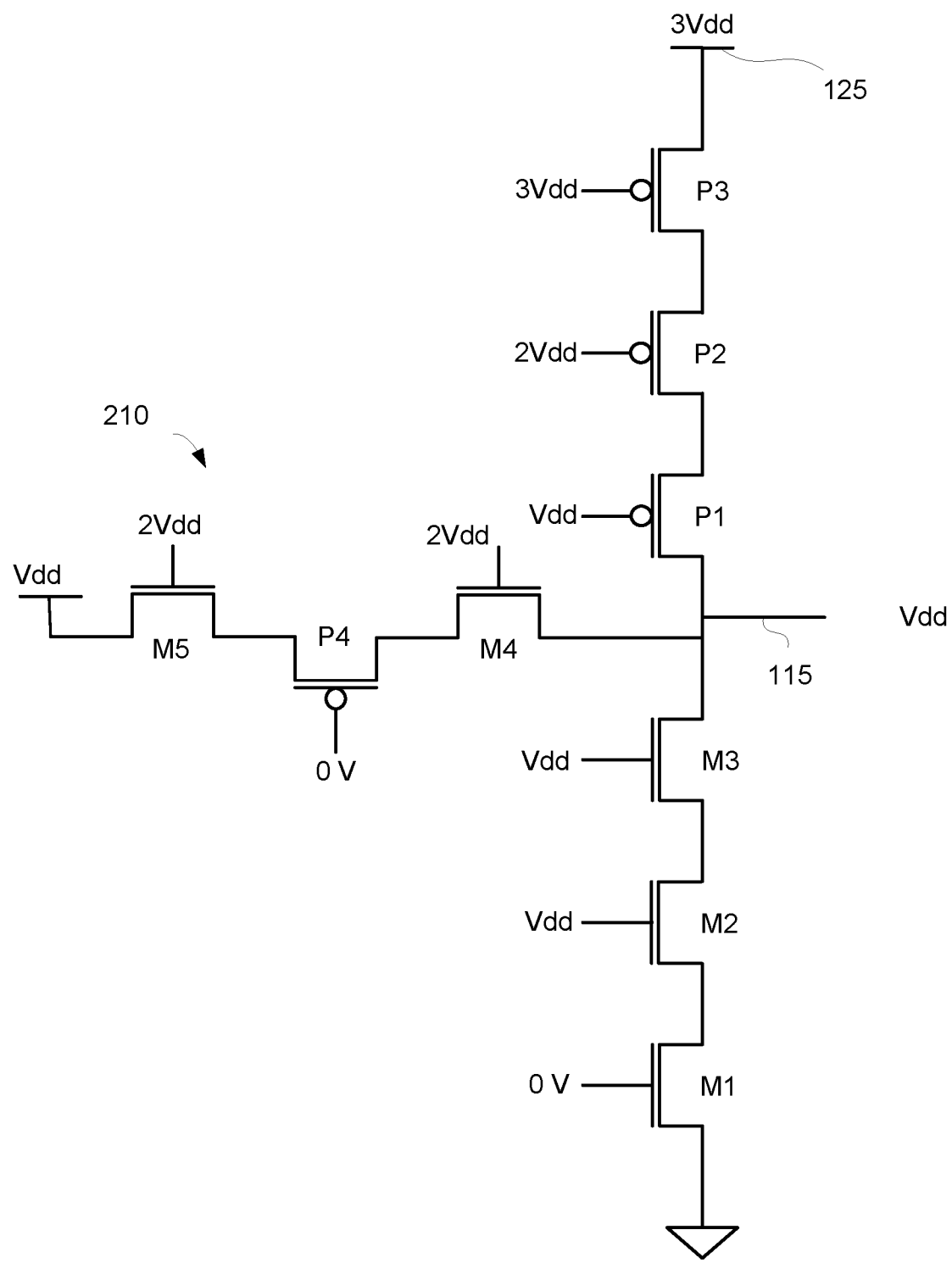
FIG. 3C is a circuit diagram of the high voltage driver of FIG. 2 showing the gate voltages for the NMOS and PMOS stacks and also of the sleep circuit during a sleep mode of the high voltage driver in accordance with an aspect of the disclosure.

If the high voltage driver is inactive and thus not being used to contribute to the output signal driving an antenna, the sleep circuit 210 conducts such as shown in FIG. 3C. Since the high voltage driver is inactive, both the PMOS stack and the NMOS stack are switched off. The gate voltages of the PMOS transistors are thus as discussed for FIG. 3A during the first clock phase. The gate voltage of transistor M1 is 0 V whereas the gates of transistors M2 and M3 are charged to Vdd. Transistor M1 is thus off and causes the NMOS stack to be non-conductive. The output node 115 is thus floating with respect to the PMOS and NMOS stacks during the sleep mode of operation. To force the sleep circuit 210 to conduct, the bias voltage circuit (or another suitable bias voltage source) charges the gate of transistor M5 to 2Vdd. Transistor M5 is thus fully switched on and charges its source to Vdd. The bias voltage circuit also grounds the gate of transistor P4 so that transistor P4 is also fully switched on to charge its drain to Vdd. Finally, the bias voltage circuit charges the gate of transistor M4 to 2Vdd so that transistor M4 is fully switched on and charges the output node 115 to Vdd.

Figure 4:
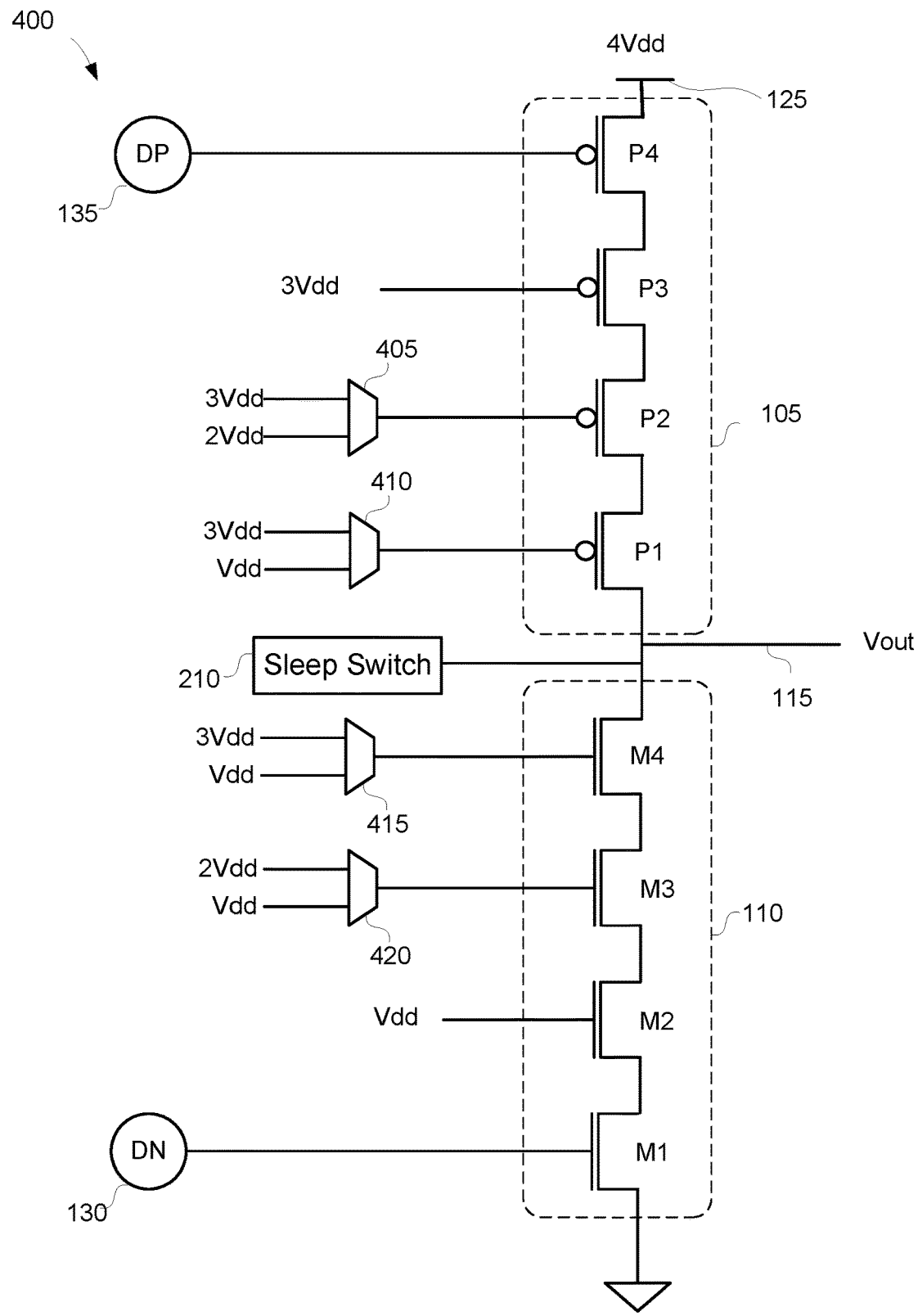
FIG. 4 is a circuit diagram of an implementation of the high voltage driver of FIG. 1 in which the NMOS and PMOS stacks each has four transistors in accordance with an aspect of the disclosure.

An example high voltage driver 400 is shown in FIG. 4 in which the PMOS stack 105 and the NMOS stack 110 each has four transistors. The power supply node 125 thus supports a power supply voltage of 4*Vdd. When the PMOS stack 105 conducts and the NMOS stack 110 does not during the second clock phase, the output node 115 is thus driven to 4*Vdd. Similarly, the output node 115 is discharged during the first clock phase while the NMOS stack 110 conducts and the PMOS stack 105 does not. An output signal at the output node 115 will thus have a 4*Vdd peak-to-peak voltage.

PMOS stack 105 includes transistors P1, P2, P3, and also a transistor P4. The source of transistor P4 couples to the power supply node 125 whereas a drain of transistor P4 couples to the source of transistor P3. The second clock source 135 drives a gate of transistor P4 with the DP clock signal that oscillates between 4Vdd in the first clock phase to 3Vdd in the second clock phase. A bias voltage circuit includes a multiplexer 410 to control the gate voltage of transistor P1 and a multiplexer 405 to control the gate voltage of transistor P2. As discussed earlier, the bias voltage circuit functions so that the transistors in PMOS stack 105 have their gates charged to a product of their index and Vdd during the first clock phase. Multiplexer 410 is thus configured to select for Vdd to charge the gate of transistor P1 during the first clock phase. Similarly, multiplexer 405 selects for 2Vdd to charge the gate of transistor P2 during the first clock phase. In both clock phases, the gate of transistor P3 is charged to 3Vdd. The transistors in the PMOS stack 105 are thus off without being exposed to excessive voltage stress during the first clock phase.

In the second clock phase, the DP clock signal drops to 3VDD so that transistor P4 is on. Similarly, the multiplexers 405 and 410 also select for 3VDD to charge the gates of their respective transistors during the second clock phase. The PMOS stack 105 is thus conductive in the second clock phase so that the output voltage Vout is charged to 4VDD without exposing the transistors in the PMOS stack 105 to excessive voltage stress.

The NMOS stack 110 includes transistors M1, M2, M3 and also a transistor M4 that has its drain coupled to the output node 115 and a source coupled to a drain of transistor M3. The first clock source 130 drives the gate of transistor M1 with the first clock signal DN that oscillates between Vdd during the first clock phase and zero volts during the second clock phase. The gate voltage of transistor M2 is maintained at Vdd during both clock phases. A multiplexer 415 selects for Vdd during the first clock phase to switch on transistor M4. Similarly, a multiplexer 420 selects for Vdd during the first clock phase to switch on transistor M3. The NMOS stack 110 is thus conductive during the first clock phase to ground the output voltage Vout without causing any excessive voltage stress on its transistors.

During the second clock phase, the DN clock signal is zero volts to switch off transistor M1. Each of the transistors M2 through M4 in the NMOS stack 110 have their gate voltages charged to a product of one less than their index and Vdd during the second clock phase. Multiplexer 415 thus selects for 3Vdd to charge the gate of transistor M4 during the second clock phase. Similarly, multiplexer 420 selects for 2Vdd during the second clock phase. The transistors in the NMOS stack 110 are thus all off during the second clock phase without any excessive voltage strain. Sleep switch 210 functions as discussed for high voltage driver 200.

Though a comparison of high voltage drivers 200 and 400, it may be seen that the multiplexer that drives the gate of transistor P1 selects between a first power supply voltage and a second power supply voltage. For multiplexer 205, the first power supply voltage is 2Vdd and the second power supply voltage is Vdd. For multiplexer 410, the first power supply voltage is 3Vdd whereas the second power supply voltage is Vdd. Multiplexers 205 and 410 are thus examples of a first multiplexer configured to select between a first power supply voltage and a second power supply voltage to drive a gate of the first PMOS transistor. This same selection is performed by multiplexers 215 and 415 with respect to driving the gate of the Nth NMOS transistor (transistor M3 for high voltage driver 200 and transistor M4 for high voltage driver 200. Multiplexers 215 and 415 are thus examples of a second multiplexer configured to select between the first power supply voltage and the second power supply voltage to drive a gate of the Nth NMOS transistor.

Figure 5:
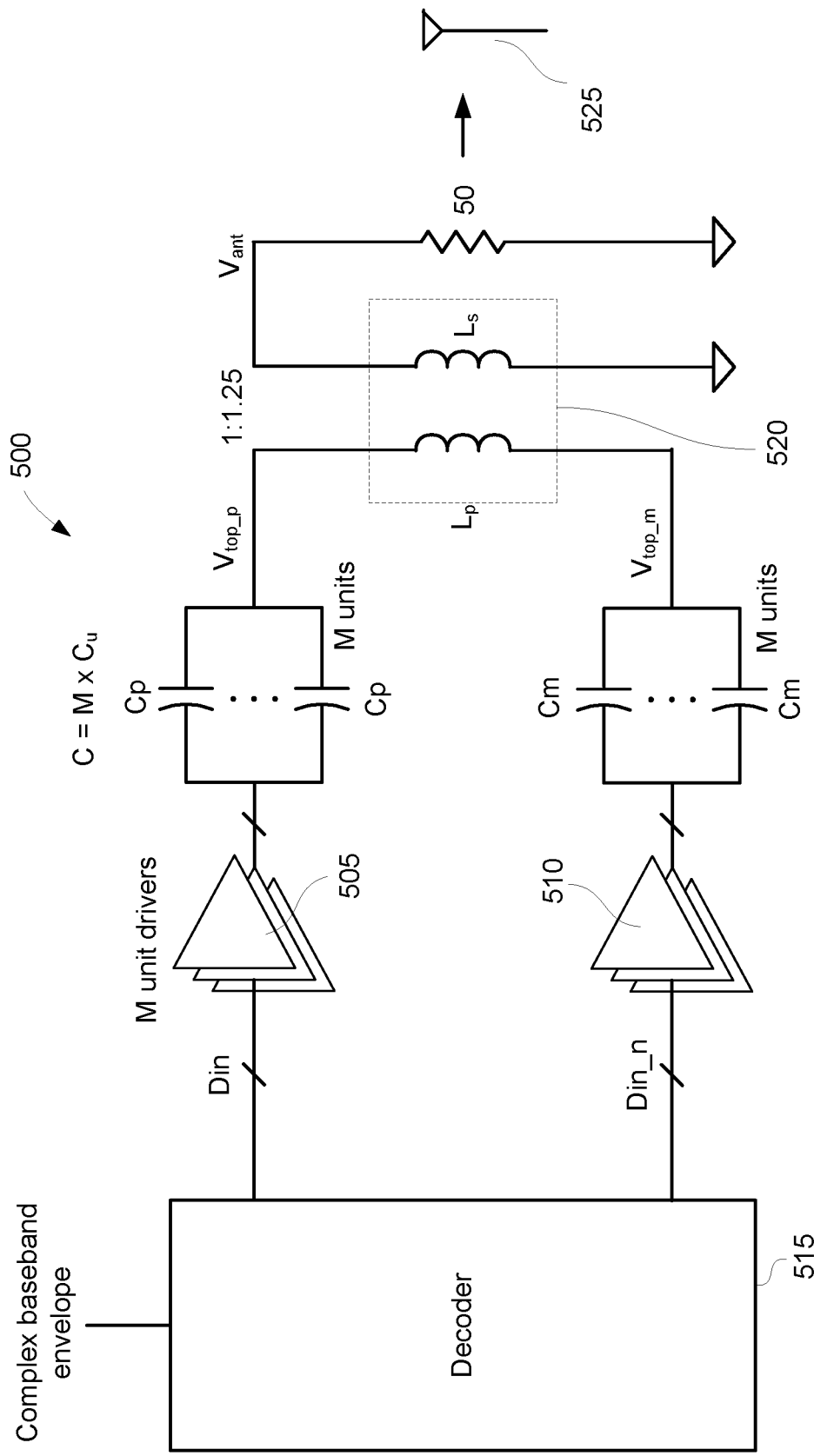
FIG. 5 is a circuit diagram of a transmitter including a plurality of high voltage drivers in accordance with an aspect of the disclosure.

An example transmitter including a plurality of high voltage drivers will now be discussed. An example transmitter 500 including a first plurality of M high voltage drivers 505 and a second plurality of M high voltage drivers 510 is shown in FIG. 5, where M is a plural positive integer. The following discussion will assume that M is 64 without loss of generality such that lower or higher values of M may be used in alternative implementations. Each high voltage driver 505 and 510 may be constructed as discussed for high voltage driver 100. In one implementation, each high voltage driver 505 and 510 is constructed as discussed for high voltage driver 200. An output node for each high voltage driver 505 couples to a corresponding capacitor Cp. Should there be 64 high voltage drivers 505, there would thus be 64 capacitors Cp. The plurality of capacitors Cp form an example of a voltage summation circuit that sums the output voltage from each high voltage driver 505. Each capacitor Cp couples between the output node of its corresponding high voltage driver 505 and a Vtop_p terminal of an input coil $L_p$ of a transformer 520 that includes an output coil $L_s$. The output coil L s couples to an antenna 525 (or antennas) as represented by a 50-ohm resistance. An output node for each high voltage driver 510 couples to a corresponding capacitor Cm. Should there be 64 high voltage drivers 510, there would thus be 64 capacitors Cm. The plurality of capacitors Cm are an example of a voltage summation circuit that sums the output voltages from high voltage drivers 510. Each capacitor Cm couples between the output node of its corresponding high voltage driver 510 and a Vtop_mp terminal of the input coil $L_p$. The capacitance of each capacitor Cm may be equal to the capacitance of each capacitor Cp.

Since the clock signals Dp and Dn (not illustrated) for each high voltage driver 505 are synchronous, they may be represented by a single clock signal Din. A decoder 515 generates Din based upon a complex digital baseband signal. Responsive to the phase of the complex baseband signal, decoder 515 adjusts the clock signal Din accordingly. Decoder 515 also generates a complement clock Din_n that is the complement (180 degrees out of phase) of Din. The complement clock Din_n, like clock Din, is just a representation of the two synchronous clock signals that control the gate of the equivalent of transistors PN and M1 in each of high voltage drivers 510. Due to their complementary phasing, high voltage drivers 505 and 510 drive the input coil $L_p$ in a differential fashion.

In addition to its phase, the complex baseband signal also has a magnitude. Based upon this magnitude, decoder 515 activates or de-activates the appropriate number of high voltage drivers 505 and 510. For example, if the complex baseband signal has a maximum magnitude, decoder 515 may activate the entire plurality of M high voltage drivers 505 and 510. As the complex baseband signal magnitude reduces from this maximum value, decoder 515 may deactivate a corresponding number of the high voltage drivers 505 and the same number of high voltage drivers 510. This is quite advantageous with respect to efficiency as modern communication protocols such as WiFi or the $5^{th}$ generation cellular standard typically have a relatively high peak to average power ratio. During moments of average power, transmitter 500 may thus save power by activating only a portion of the plurality of M high voltage drivers 505 and the same portion of the plurality of M high voltage drivers 510. But during moments of peak power, transmitter 500 may activate all the plurality of M high voltage drivers 505 and all of the plurality of M high voltage drivers 510.

Suppose that Vdd is 1.3 V and each high voltage driver 505 and 510 is constructed as discussed for high voltage driver 200 (N=3). The output node of each high voltage driver 505 may thus cycle between ground and 3.9 V. Should all 64 high voltage drivers 505 be activated, the $V_{top\_p}$ terminal of the input coil $L_s$ is charged to approximately 3.9V during the second clock phase of Din. Since the high voltage drivers 510 function to charge the opposite terminal Vtop m of the input coil $L_s$, the terminal Vtop m is thus charged to −3.9V during the first clock phase of Din. Such a relatively high output voltage swing thus does not need a robust step-up transformer to drive the corresponding antenna(s). In one implementation, transformer 520 may thus have a relatively low turn ratio of 1:1.25. Such a relatively low turn ratio eases the manufacture of transformer 520 as it may be readily implemented in the metal layers of an integrated circuit including transformer 500. In addition, the relatively low turn ratio of transformer 520 reduces the power loss. Transmitter 500 may thus provide a robust peak-to-peak output voltage at the antenna(s) it drives yet it is entirely compatible with a CMOS process node.

In certain aspects, the high voltage drivers described herein may form a portion of a circuit forming a digital-to-analog (DAC) converter that is configured to output a radio frequency (RF) modulated signal (e.g., forming a portion of an "RF-DAC" based transmitter architecture where the transmitter circuitry 500 described with respect to FIG. 5 may effectively function as combined DAC, up conversion mixer, and power amplifier).

Figure 6:
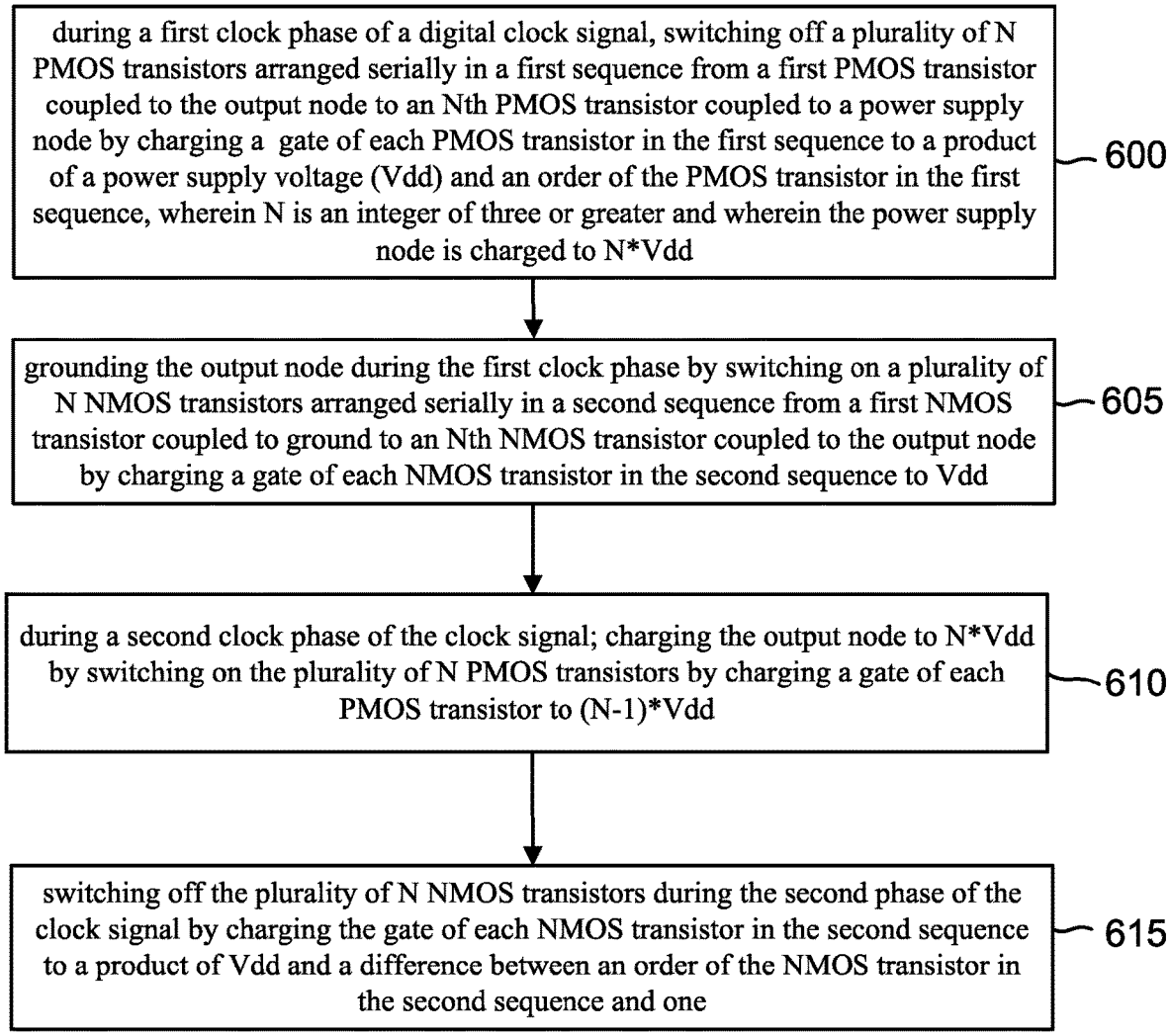
FIG. 6 is a flowchart for an example high voltage driver method of operation in accordance with an aspect of the disclosure.

A method of operation for a high voltage driver will now be discussed with respect to the flowchart of FIG. 6. The method includes an act 600 that occurs during a first clock phase of a clock signal and includes switching off a plurality of N PMOS transistors arranged serially in a first sequence from a first PMOS transistor coupled to the output node to an Nth PMOS transistor coupled to a power supply node by charging a gate of each PMOS transistor in the first sequence to a product of a power supply voltage (Vdd) and an order of the PMOS transistor in the first sequence, wherein N is an integer of three or greater and wherein the power supply node is charged to N*Vdd. An example of the first sequence of PMOS transistors is the PMOS stack of FIG. 3A. Each PMOS transistor has an order in this first sequence. For example, transistor P1 is the first in this order. Transistor P2 is the second. Finally, transistor P3 is the third. The gate of each PMOS transistor is charged to a product of Vdd and its order. For example, the gate of transistor P1 is charged to Vdd, the gate of transistor P2 is charged to 2*Vdd, and the gate of transistor P3 is charged to 3*Vdd.

The method also includes an act 605 of grounding the output node during the first clock phase by switching on a plurality of N NMOS transistors arranged serially in a second sequence from a first NMOS transistor coupled to ground to an Nth NMOS transistor coupled to the output node by charging a gate of each NMOS transistor in the second sequence to Vdd. An example of act 605 is the charging of the gate of each NMOS transistor in the NMOS stack of FIG. 3A to Vdd.

The method further includes an act 610 that occurs during a second clock phase of the clock signal and includes charging the output node to N*Vdd by switching on the plurality of N PMOS transistors by charging a gate of each PMOS transistor to (N−1)*Vdd. An example of act 610 is shown in FIG. 3B in which N equals 3 so that (N−1) equals 2. As shown in FIG. 3B, the gate of each PMOS transistor in the PMOS stack is thus charged to 2*Vdd.

Finally, the method includes an act 615 of switching off the plurality of N NMOS transistors during the second phase of the clock signal by charging the gate of each NMOS transistor in the second sequence to a product of Vdd and a difference between an order of the NMOS transistor in the second sequence and one. An example of act 615 is shown in FIG. 3B for the NMOS stack. For example, the order of transistor M1 in the NMOS stack is of course one so that a difference of this order and one is zero. Thus, the gate of transistor M1 is indeed discharged during the second clock phase. Similarly, the order of transistor M2 in the NMOS stack is two so that a difference of this order and one is in turn one. The gate of transistor M2 is thus charged to Vdd*(2−1), which is Vdd. In addition, the order of transistor M3 is three so that a difference of this order and one is in turn two. The gate of transistor M3 is thus charged to Vdd*(3−1), which is 2*Vdd.

The disclosure will now be summarized through a series of clauses:

Clause 1. A voltage driver, comprising:
  a plurality of p-type metal-oxide semiconductor (PMOS) transistors arranged in series from a first PMOS transistor to (N−1)th PMOS transistor, wherein N is an integer of three or greater and the first PMOS transistor has a drain connected to an output node of the voltage driver;
  an Nth PMOS transistor having a source coupled to a power supply voltage node and having a drain coupled to a source of the (N−1)th PMOS transistor;
  a first NMOS transistor having a source coupled to ground;
  a plurality of n-type metal-oxide semiconductor (NMOS) transistors arranged in series from a second NMOS transistor to an Nth NMOS transistor, the Nth NMOS transistor having a drain coupled to the output node of the voltage driver and the second NMOS transistor having a source coupled to a drain of the first NMOS transistor;

a first clock source configured to drive a gate of the first NMOS transistor with a first clock signal that cycles between a power supply voltage (Vdd) during a first clock phase and ground during a second clock phase; and a second clock source configured to drive a gate of the Nth PMOS transistor with a second clock signal that cycles between N*Vdd during the first clock phase and (N−1)*Vdd during the second clock phase.

Clause 2. The voltage driver of clause 1, wherein the power supply voltage node is configured to be charged to N*Vdd.

Clause 3. The voltage driver of any of clauses 1-2, wherein N equals 4.

Clause 4. The voltage driver of any of clauses 1-3, further comprising:

a bias voltage circuit configured to charge a gate of each PMOS transistor in the plurality of PMOS transistors to (N−1)*Vdd during the second clock phase.

Clause 5. The voltage driver of clause 4, wherein the bias voltage circuit is further configured to charge a gate of each NMOS transistor in plurality of NMOS transistors to Vdd during the first clock phase.

Clause 6. The voltage driver of clause 4, wherein the bias voltage circuit is further configured to charge the gate of the first PMOS transistor to Vdd during the first clock phase and to charge the gate of each successive PMOS transistor following the first PMOS transistor in the plurality of PMOS transistors to a sum of Vdd and a gate voltage of a preceding PMOS transistor in the plurality of PMOS transistors during the first clock phase.

Clause 7. The voltage driver of clause 4, wherein the bias voltage circuit is further configured to charge the gate of the second NMOS transistor to Vdd during the second clock phase and to charge the gate of each successive NMOS transistor following the second NMOS transistor in the plurality of NMOS transistors to a sum of Vdd and a gate voltage of a preceding NMOS transistor in the plurality of NMOS transistors during the second clock phase.

Clause 8. The voltage driver of any of clauses 1-7, wherein N equals three.

Clause 9. The voltage driver of clause 8, wherein the bias voltage circuit comprises a first multiplexer configured to select between Vdd and 2*Vdd to drive a gate of the first PMOS transistor during the first and second clock phases.

Clause 10. The voltage driver of clause 9, wherein the bias voltage circuit further comprises a second multiplexer configured to select between Vdd and 2*Vdd to drive a gate of the Nth NMOS transistor during the first and second clock phases.

Clause 11. The voltage driver of clause 3, further comprising:

a sleep circuit coupled between a power supply node for Vdd and the output node, wherein the sleep circuit is configured to be non-conductive during the first and second clock phases.

Clause 12. The voltage driver of clause 11, wherein the first clock source is configured to ground the gate of the first NMOS transistor during a sleep mode of the voltage driver, and wherein the second clock source is configured to charge the gate of the Nth PMOS transistor to N*Vdd during the sleep mode of the voltage driver.

Clause 13. The voltage driver of clause 12, wherein the sleep circuit is configured to be conductive to charge the output node to Vdd during the sleep mode of the voltage driver.

Clause 14. The voltage driver of clause 12, wherein the sleep circuit comprises a plurality of transistors coupled between the power supply node for Vdd and the output node.

Clause 15. The voltage driver of clause 14, wherein the plurality of transistors comprises an (N+1)th NMOS transistor having a source coupled to the output node, an (N+1)th PMOS transistor having a drain coupled to a drain of the (N+1)th NMOS transistor, and an (N+2)th NMOS transistor having a source coupled to a source of the (N+1)th PMOS transistor and having a drain coupled to the power supply node for Vdd.

Clause 16. A power amplifier comprising:

a plurality of first voltage drivers, each first voltage driver including a plurality of N PMOS transistors coupled between a power supply node and an output node and including a plurality of N NMOS transistors coupled between the output node and ground, wherein N is a positive integer of 3 or greater;

a decoder configured to decode a baseband signal to select whether each first voltage driver is inactive or active based upon a magnitude of the baseband signal and to phase a first clock signal and a second clock signal based upon a phase of the baseband signal, wherein the first clock signal is configured to cycle between ground and a power supply voltage (Vdd) to drive a gate of a first NMOS transistor in each plurality of N NMOS transistors in each active one of the voltage drivers and the second clock signal is configured to cycle between (N−1)*Vdd and N*Vdd to drive a gate of an Nth PMOS transistor in each plurality of N PMOS transistors in each active one of the voltage drivers; and a voltage summation circuit coupled to each output node and configured to sum an output voltage at each output node.

Clause 17. The power amplifier of clause 16, wherein the power amplifier is included in an integrated circuit having a transformer comprising a first coil and a second coil, and wherein the voltage summation circuit comprises a plurality of N first capacitors, each first capacitor having a first terminal coupled to an output node of a respective one of the first voltage drivers and having a second terminal coupled to the first coil.

Clause 18. The power amplifier of clause 17, wherein the second coil is coupled to at least one antenna.

Clause 19. The power amplifier of clause 18, wherein each first capacitor is coupled to a first end of the first coil, the power amplifier further comprising:

a plurality of second voltage drivers; and a plurality of second capacitors, each second capacitor coupled between an output node of a respective one of the second voltage drivers and a second end of the first coil.

Clause 20. The power amplifier of clause 19, wherein the decoder is further configured to select whether each second voltage driver is inactive or active based upon the magnitude of the baseband signal.

Clause 21. A method of driving an output node from a voltage driver, comprising:

during a first clock phase of a clock signal, switching off a plurality of N PMOS transistors arranged serially in a first sequence from a first PMOS transistor coupled to the output node to an Nth PMOS transistor coupled to a power supply node by charging a gate of each PMOS transistor in the first sequence to a product of a power supply voltage (Vdd) and an order of the PMOS transistor in the first sequence, wherein N is an integer of three or greater and wherein the output node is charged to N*Vdd; and grounding the output node during the first clock phase by switching on a plurality of N NMOS transistors arranged serially in a second sequence from a first NMOS transistor coupled to ground to an Nth NMOS transistor coupled to the output node by charging a gate of each NMOS transistor in the second sequence to Vdd.

Clause 22. The method of clause 21, further comprising:
during a second clock phase of the clock signal; charging the output node to N*Vdd by switching on the plurality of N PMOS transistors by charging a gate of each PMOS transistor to (N−1)*Vdd; and
switching off the plurality of N NMOS transistors during the second phase of the clock signal by charging the gate of each NMOS transistor in the second sequence to a product of Vdd and a difference between an order of the NMOS transistor in the second sequence and one.

Clause 23. The method of clause 22, further comprising:
during the first clock phase and the second clock phase, switching off a sleep circuit coupled between the output node and a power supply for Vdd.

Clause 24. The method of clause 23, further comprising:
during a sleep mode for the voltage driver, switching on the sleep circuit to charge the output node to Vdd.

Clause 25. A voltage driver, comprising:
a plurality of PMOS transistors arranged in series from a first PMOS transistor to an Nth PMOS transistor, wherein the first PMOS transistor has a drain coupled to an output node and the Nth PMOS transistor has a source coupled to a power supply node, wherein N is an integer of three or greater;
a plurality of NMOS transistors arranged in series from a first NMOS transistor to an Nth NMOS transistor, wherein the first NMOS transistor has a source coupled to ground and the Nth NMOS transistor has a drain coupled to the output node;
a first multiplexer configured to select between a first power supply voltage and a second power supply voltage to drive a gate of the first PMOS transistor; and
a second multiplexer configured to select between the first power supply voltage and the second power supply voltage to drive a gate of the Nth NMOS transistor.

Clause 26. The voltage driver of clause 25, wherein N equals three and the first power supply voltage equals twice the second power supply voltage, and wherein a second PMOS transistor in the plurality of PMOS transistors has a gate coupled to the first power supply voltage and a second NMOS transistor in the plurality of NMOS transistors has a gate coupled to the second power supply voltage.

Clause 27. The voltage driver of clause 25, wherein N equals four and the first power supply voltage equals three times the second power supply voltage, and wherein a third PMOS transistor in the plurality of PMOS transistors has a gate coupled to the first power supply voltage and a second NMOS transistor in the plurality of NMOS transistors has a gate coupled to the second power supply voltage.

Clause 28. The voltage driver of any of clauses 25-27, further comprising:
a first clock source configured to drive a gate of the first NMOS transistor; and
a second clock source configured to drive a gate of the Nth PMOS transistor.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A voltage driver, comprising:
a plurality of p-type metal-oxide semiconductor (PMOS) transistors arranged in series from a first PMOS transistor to an (N−1)th PMOS transistor, wherein N is an integer of three or greater and the first PMOS transistor has a drain coupled to an output node of the voltage driver;
an Nth PMOS transistor having a source coupled to a power supply node and having a drain coupled to a source of the (N−1)th PMOS transistor;
a first n-type metal-oxide semiconductor (NMOS) transistor having a source coupled to ground;
a plurality of NMOS transistors arranged in series from a second NMOS transistor to an Nth NMOS transistor, the Nth NMOS transistor having a drain coupled to the output node of the voltage driver and the second NMOS transistor having a source coupled to a drain of the first NMOS transistor;
a first clock source configured to drive a gate of the first NMOS transistor with a first clock signal that cycles between a power supply voltage (Vdd) during a first clock phase and ground during a second clock phase;
a second clock source configured to drive a gate of the Nth PMOS transistor with a second clock signal that cycles between N*Vdd during the first clock phase and (N−1)*Vdd during the second clock phase; and
a sleep circuit coupled between a power source for Vdd and the output node, wherein the sleep circuit is configured to be non-conductive during the first clock phase and during the second clock phase, and the power supply node is configured to be charged to N*Vdd.

2. The voltage driver of claim 1, wherein N equals 4.

3. The voltage driver of claim 1, further comprising:
a bias voltage circuit configured to charge a gate of each PMOS transistor in the plurality of PMOS transistors to (N−1)*Vdd during the second clock phase.

4. The voltage driver of claim 3, wherein the bias voltage circuit is further configured to charge a gate of each NMOS transistor in the plurality of NMOS transistors to Vdd during the first clock phase.

5. The voltage driver of claim 3, wherein the bias voltage circuit is further configured to charge the gate of the first PMOS transistor to Vdd during the first clock phase and to charge the gate of each successive PMOS transistor following the first PMOS transistor in the plurality of PMOS transistors to a sum of Vdd and a gate voltage of a preceding PMOS transistor in the plurality of PMOS transistors during the first clock phase.

6. The voltage driver of claim 3, wherein the bias voltage circuit is further configured to charge the gate of the second NMOS transistor to Vdd during the second clock phase and to charge the gate of each successive NMOS transistor following the second NMOS transistor in the plurality of NMOS transistors to a sum of Vdd and a gate voltage of a preceding NMOS transistor in the plurality of NMOS transistors during the second clock phase.

7. The voltage driver of claim 3, wherein N equals three.

8. The voltage driver of claim 7, wherein the bias voltage circuit comprises a first multiplexer configured to select between Vdd and 2*Vdd to drive a gate of the first PMOS transistor during the first clock phase and during the second clock phase.

9. The voltage driver of claim 8, wherein the bias voltage circuit further comprises a second multiplexer configured to select between Vdd and 2*Vdd to drive a gate of the Nth NMOS transistor during the first clock phase and during the second clock phase.

10. The voltage driver of claim 1, wherein the first clock source is configured to ground the gate of the first NMOS transistor during a sleep mode of the voltage driver, and wherein the second clock source is configured to charge the gate of the Nth PMOS transistor to N*Vdd during the sleep mode of the voltage driver.

11. The voltage driver of claim 10, wherein the sleep circuit is configured to be conductive to charge the output node to Vdd during the sleep mode of the voltage driver.

12. The voltage driver of claim 10, wherein the sleep circuit comprises a plurality of transistors coupled between the power source for Vdd and the output node.

13. The voltage driver of claim 12, wherein the plurality of transistors comprises an (N+1)th NMOS transistor having a source coupled to the output node, an (N+1)th PMOS transistor having a drain coupled to a drain of the (N+1)th NMOS transistor, and an (N+2)th NMOS transistor having a source coupled to a source of the (N+1)th PMOS transistor and having a drain coupled to the power source for Vdd.

14. A power amplifier comprising:
a plurality of first voltage drivers, each first voltage driver including:
a plurality of N PMOS transistors arranged in series from a first PMOS transistor to an Nth PMOS transistor between a power supply node and an output node; and
a plurality of N NMOS transistors arranged in series from a first NMOS transistor to an Nth NMOS transistor between the output node and ground, wherein N is a positive integer of 3 or greater;
a decoder configured to:
decode a baseband signal to select whether each first voltage driver is inactive or active based upon a magnitude of the baseband signal;
deactivate a number of the first voltage drivers based upon the magnitude of the baseband signal when the magnitude of the baseband signal is below a maximum magnitude; and
phase a first clock signal and a second clock signal based upon a phase of the baseband signal,
wherein the first clock signal is configured to cycle between ground and a power supply voltage (Vdd) to drive a gate of the first NMOS transistor in each active one of the first voltage drivers and the second clock signal is configured to cycle between (N−1)*Vdd and N*Vdd to drive a gate of the Nth PMOS transistor in each active one of the first voltage drivers, and
wherein both the first NMOS transistor and the Nth PMOS transistor in each inactive one of the first drivers are turned off; and
a voltage summation circuit coupled to each output node and configured to sum an output voltage at each output node.

15. The power amplifier of claim 14, wherein the power amplifier is included in an integrated circuit having a transformer comprising a first coil and a second coil, and wherein the voltage summation circuit comprises a plurality of N first capacitors, each first capacitor having a first terminal coupled to the output node of a respective one of the first voltage drivers and having a second terminal coupled to the first coil.

16. The power amplifier of claim 15, wherein the second coil is coupled to at least one antenna.

17. The power amplifier of claim 15, wherein each first capacitor is coupled to a first end of the first coil, the power amplifier further comprising:
a plurality of second voltage drivers; and
a plurality of second capacitors, each second capacitor coupled between an output node of a respective one of the second voltage drivers and a second end of the first coil.

18. The power amplifier of claim 17, wherein the decoder is further configured to select whether each second voltage driver is inactive or active based upon the magnitude of the baseband signal.

19. The power amplifier of claim 14, wherein a gate voltage of the first NMOS transistor in each inactive one of the first drivers is maintained at ground, and a gate voltage of the Nth PMOS transistor in each inactive one of the first drivers is maintained at N*Vdd.

20. The power amplifier of claim 14, wherein the decoder is configured to activate all of the first voltage drivers when the magnitude of the baseband signal is at the maximum magnitude.

21. The power amplifier of claim 20, wherein the decoder is configured to, as the magnitude of the baseband signal reduces from the maximum magnitude, deactivate a corresponding number of the first voltage drivers.

22. The power amplifier of claim 14, wherein each first voltage driver further includes a sleep circuit coupled between a power source for Vdd and the output node, wherein the sleep circuit is configured to be non-conductive when the first voltage driver is active, and conductive when the first voltage driver is inactive.

23. A method of driving an output node from a voltage driver, comprising:
during a first clock phase of a clock signal, switching off a plurality of N PMOS transistors arranged serially in a first sequence from a first PMOS transistor coupled to the output node to an Nth PMOS transistor coupled to a power supply node by charging a gate of each PMOS transistor in the first sequence to a product of a power supply voltage (Vdd) and an order of the PMOS transistor in the first sequence, wherein N is an integer of three or greater and wherein the power supply node is charged to N*Vdd; and
grounding the output node during the first clock phase by switching on a plurality of N NMOS transistors arranged serially in a second sequence from a first NMOS transistor coupled to ground to an Nth NMOS transistor coupled to the output node by charging a gate of each NMOS transistor in the second sequence to Vdd;
during a second clock phase of the clock signal, charging the output node to N*Vdd by switching on the plurality of N PMOS transistors by charging a gate of each PMOS transistor to (N−1)*Vdd;
switching off the plurality of N NMOS transistors during the second phase of the clock signal by charging the gate of each NMOS transistor in the second sequence to a product of Vdd and a difference between an order of the NMOS transistor in the second sequence and one; and during the first clock phase and the second clock phase, switching off a sleep circuit coupled between the output node and a power source for Vdd.

24. The method of claim 23, further comprising:
during a sleep mode for the voltage driver, switching on the sleep circuit to charge the output node to Vdd.

25. A voltage driver, comprising:
a plurality of PMOS transistors arranged in series from a first PMOS transistor to an Nth PMOS transistor, wherein the first PMOS transistor has a drain coupled to an output node and the Nth PMOS transistor has a source coupled to a power supply node, wherein N is an integer of three or greater;
a plurality of NMOS transistors arranged in series from a first NMOS transistor to an Nth NMOS transistor, wherein the first NMOS transistor has a source coupled to ground and the Nth NMOS transistor has a drain coupled to the output node;
a first multiplexer configured to select between a first power supply voltage and a second power supply voltage to drive a gate of the first PMOS transistor;
a second multiplexer configured to select between the first power supply voltage and the second power supply voltage to drive a gate of the Nth NMOS transistor; and
a sleep circuit coupled between a power source for Vdd and the output node, wherein the sleep circuit is configured to be non-conductive during the first clock phase and during the second clock phase, and to be conductive during a sleep mode of the voltage driver.

26. The voltage driver of claim 25, wherein N equals three and the first power supply voltage equals twice the second power supply voltage, and wherein a second PMOS transistor in the plurality of PMOS transistors has a gate coupled to the first power supply voltage and a second NMOS transistor in the plurality of NMOS transistors has a gate coupled to the second power supply voltage.

27. The voltage driver of claim 25, wherein N equals four and the first power supply voltage equals three times the second power supply voltage, and wherein a third PMOS transistor in the plurality of PMOS transistors has a gate coupled to the first power supply voltage and a second NMOS transistor in the plurality of NMOS transistors has a gate coupled to the second power supply voltage.

28. The voltage driver of claim 25, further comprising:
a first clock source configured to drive a gate of the first NMOS transistor; and
a second clock source configured to drive a gate of the Nth PMOS transistor.

* * * * *